(12) United States Patent
Matsunaga et al.

(10) Patent No.: US 6,256,187 B1
(45) Date of Patent: Jul. 3, 2001

(54) ELECTROSTATIC CHUCK DEVICE

(75) Inventors: Tadao Matsunaga, Shimizu; Masaharu Kobayashi, Shizuoka, both of (JP)

(73) Assignee: Tomoegawa Paper Co., Ltd., Tokyo (JP)

( * ) Notice: Subject to any disclaimer, the term of this patent is extended or adjusted under 35 U.S.C. 154(b) by 0 days.

(21) Appl. No.: 09/363,410

(22) Filed: Jul. 29, 1999

(30) Foreign Application Priority Data

Aug. 3, 1998 (JP) .................................................. 10-219414

(51) Int. Cl.$^7$ .................................................. H02N 13/00
(52) U.S. Cl. ............................ 361/234; 279/128; 429/208
(58) Field of Search .................................. 361/234, 230, 361/233, 235; 428/209; 279/128

(56) References Cited

U.S. PATENT DOCUMENTS

| | | | |
|---|---|---|---|
| 4,379,887 | * 4/1983 | Overbergh | 525/184 |
| 5,851,641 | * 12/1998 | Matsunaga et al. | 428/209 |
| 6,063,838 | * 5/2000 | Patnode et al. | 523/172 |
| 6,071,630 | * 6/2000 | Tomaru et al. | 428/627 |

* cited by examiner

*Primary Examiner*—Fritz Fleming
(74) *Attorney, Agent, or Firm*—Oblon, Spivak, McClelland, Maier & Neustadt, P.C.

(57) ABSTRACT

An electrostatic chuck device is characterized in the provision of a ceramic layer, which serves as an adsorption surface, via an electricity insulating elastic layer, and an electrode that is formed between the ceramic layer and the electricity insulating elastic layer. The electricity insulating elastic layer consists of an adhesive that contains a rubber component and a phenol-type antioxidant. This electrostatic chuck device does not easily experience wear or deformation, and has extremely high durability. The electricity insulating elastic layer relieves stress caused by differences in coefficients of thermal expansion during heating, or by slight volume changes in the resin material. As a result, the stress applied on the ceramic layer can be reduced, making it possible to limit a reduction in the degree of flatness and the like.

11 Claims, 5 Drawing Sheets

ELECTROSTATIC CHUCK DEVICE

BACKGROUND OF THE INVENTION

1. Field of the Invention

The present invention relates to an electrostatic chuck device for using electrostatic energy to fix semiconductors or conductors like wafers in place by adsorption.

2. Description of the Related Art

Chuck devices are used for fixing a semiconductor wafer in place at a specific site in the processing equipment during the step in which the semiconductor wafer is worked. Devices employing mechanical, vacuum and electrostatic means are available as chuck devices. Of these, an electrostatic chuck device offers the advantages of enabling adsorption even when the wafer is not flat, easy handling, and applicability in a vacuum.

One example of a conventional electrostatic chuck device is disclosed in Japanese Patent Application, Second Publication No. Hei 5-87177. As shown in FIG. 4, in this device, an adhesive layer 2a, insulating film layer 4, adhesive layer 2b, electrode 3b consisting of a thin metallic plate, adhesive layer 2c, and insulating film layer 7 are sequentially laminated onto a metal substrate 1. Wafer 5 is adsorbed to wafer adsorbing surface, which is the upper surface of insulating film layer 7. A temperature adjusting means 6 is formed inside metal substrate 1 for adjusting the temperature by passing through constant temperature water or the like.

FIG. 5 shows the electrostatic chuck device disclosed in Japanese Patent Application, First Publication No. Hei 8-148549. This device is designed so that a relatively thick insulating adhesive layer 2 is formed onto metal substrate 1. An electrode 3a formed of a vapor deposited or plated metal coating is adhered to the bottom surface of an insulating film layer 7, which is adhered on to insulating adhesive layer 2. Semiconductor wafer 5 is then adsorbed to this insulating film layer 7.

It is, by the way, desirable that such devices as these have a high coefficient of thermal conductivity while at the same time maintaining electricity insulating properties. When coefficient of thermal conductivity is low, the efficacy of the temperature adjusting means is insufficient, causing the wafer to experience an abnormal increase in temperature during processing.

In recent years, it has been proposed to improve the ability to transfer heat from the wafer to the metal substrate while at the same time maintaining high electricity insulating properties, by disposing a ceramic plate that has excellent electricity insulating properties and thermal conductivity which is superior to that of resins.

Typically, thermosetting adhesives such as epoxy-type adhesives are used as the adhesive for adhering the ceramic plate. However, epoxy-type adhesives have especially high Young's modulus after hardening and experience volume changes to some extent during hardening.

For this reason, the adhesive is not able to absorb stress which is generated due to different coefficients of thermal expansion between the metal substrate and the ceramic plate, and the adhesive separates from the ceramic plate, particularly at the outer periphery thereof, causing a deterioration in thermal conductivity at these areas of separation. As a result, cooling of the outer periphery of the wafer becomes difficult. In addition, because the ceramic plate employed is typically very thin, when stress is applied on the ceramic plate due to volume changes in the adhesive layers, a variety of problems occur as bowing of the ceramic plate so that there is a deterioration in the flatness of the wafer adsorbing surface, a decrease in the wafer adsorbing force, and significant leaking of the helium gas used for cooling which is supplied in small amounts between the wafer adsorbing surface and the wafer.

As in the conventional examples described above, when made of a resin material, wafer adsorbing surface is gradually worn due to repeated contact with the wafer. In addition, damage or deformation may occur in the wafer adsorbing surface due to foreign objects. Accordingly, the durability of such resin wafer adsorbing surface has not been sufficient.

In addition, there are other problems encountered such as gradual exhaustion and deterioration due to subjection to various reactions and dry etching with plasma during wafer processing, a deterioration in the electricity insulating properties of the electrostatic chuck device over a relatively short period of time due to damage imparted during handling or the like, poor durability, and short life.

Moreover, another problem which occurs is that insulation breaks down when microscopic damage occurs to the adsorbing surface.

SUMMARY OF THE INVENTION

The present invention was conceived in consideration of the above described circumstances, and has as its objective the provision of a highly durable electrostatic chuck device which can prevent a deterioration in the degree of flatness of the wafer adsorbing surface, bowing of the ceramic plate and peeling of the adhesive layer from the ceramic plate over a long period of time.

In order to achieve the above-stated objective, the electrostatic chuck device according to the present invention is characterized in that a ceramic layer, forming the adhering surface, is provided on top of a metal substrate via an electricity insulating elastic layer, and an electrode is formed in between the electricity insulating elastic layer and the ceramic layer, the electricity insulating elastic layer consisting of an adhesive that contains a rubber component and a phenol-type antioxidant.

In addition, an insulating film layer can be formed in between the electricity insulating elastic layer and the electrode.

The present invention's electrostatic chuck device is designed so that an insulating adhesive layer is formed to at least one surface of the electricity insulating elastic layer.

Because the adsorbing surface is formed of a ceramic layer in the present invention's electrostatic chuck device, wear and deformation do not readily occur. As a result, durability is extremely high.

Moreover, even if there is stress caused by the different coefficients of thermal expansion during heat treatment, or slight volume changes in the resin material, the electricity insulating elastic layer relieves that stress, and reduces the stress on the ceramic layer. Thus, a reduction in the degree of flatness can be avoided.

By including a phenol-type antioxidant having superior thermal resistance in the electricity insulating elastic layer, radicals generated by the rubber component are efficiently absorbed even at high temperatures, making it possible to prevent oxidative deterioration of the rubber component over a long period of time. As a result, such problems can be prevented over a long period of time as the occurrence of deformations in the ceramic layer, a decline in the ability to cool the adsorbed object due to partial peeling of the joining boundary between the ceramic layer and the adhesive layer, a reduction in the adsorbing force due to a deterioration in the degree of flatness of the adsorbing surface, and the like.

In addition, by providing an insulating adhesive layer in contact with at least the surface of the electricity insulating elastic layer that is on the metal substrate side, and preferably in contact with both surfaces of the electricity insulating elastic layer, it is possible to prevent the occurrence of tacking on the surface, improve operability during manufacture of the electrostatic chuck, and increase productivity.

The first embodiment of the present invention's method for manufacturing an electrostatic chuck device is characterized in the provision of 1) a step for forming an electrode layer on one surface of the insulating film; 2) a step for laminating a ceramic layer on to the electrode layer via an adhesive; 3) a step for laminating an electricity insulating elastic layer containing a rubber component and phenol-type antioxidant to the non-electrode layer surface of the insulating film; and 4) a step for bonding the laminate obtained in 3) to the metal substrate.

A second embodiment of the present invention's electrostatic chuck device is characterized in the provision of 1) a step for forming an electrode layer on one surface of the insulating film; 2) a step for laminating a ceramic layer on to the electrode layer via an adhesive; 3) a step for sequentially laminating an electricity insulating elastic layer containing a rubber component and phenol-type antioxidant, and an insulating adhesive layer to the non-electrode layer surface of the insulating film; and 4) a step for stacking and bonding the insulating adhesive layer to the metal substrate.

A third embodiment of the present invention's electrostatic chuck device is characterized in the provision of 1) a step for forming an electrode layer on one surface of the insulating film; 2) a step for laminating a ceramic layer on to the electrode layer via an adhesive; 3) a step for forming an adhesive sheet by laminating an insulating adhesive layer to at least one surface of an electricity insulating elastic layer containing a rubber component and a phenol-type antioxidant; and 4) a step for bonding the non-electrode layer surface of the insulating film to the metal substrate via the adhesive sheet.

DESCRIPTION OF THE PREFERRED EMBODIMENTS

Figure 1:
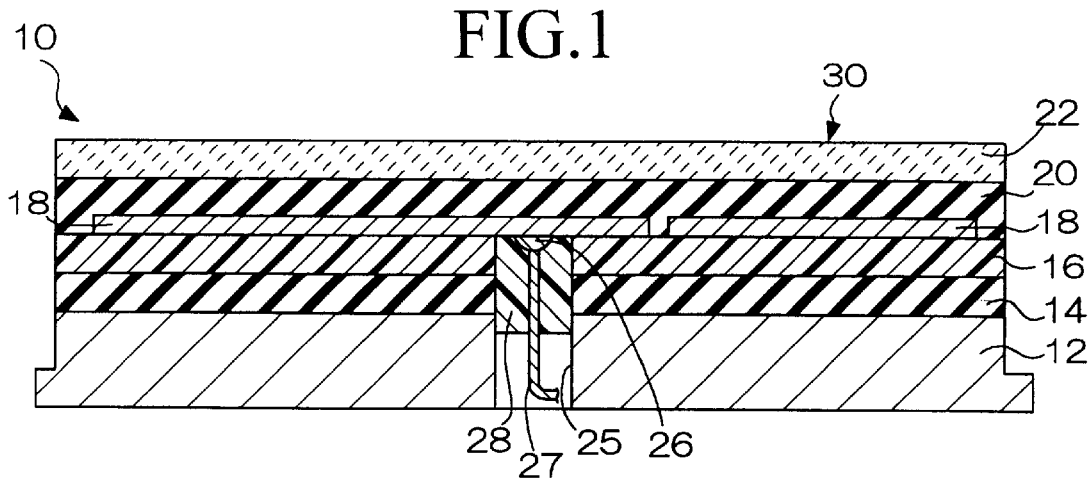
FIG. 1 is a lateral cross-section showing a portion of one preferred embodiment of the electrostatic chuck device according to the present invention.

Embodiments of the present invention's electrostatic chuck device will now be explained with reference to FIGS. 1 and 2.

This electrostatic chuck device 10 is approximately formed such that a disc-shaped metal substrate 12, electricity insulating elastic layer 14, insulating film layer 16, adhesive layer 20, and ceramic layer 22 are laminated sequentially starting from the bottom, with electrodes 18,18 formed to a specific site on insulating film layer 16.

A known material such as is typically employed in conventional electrostatic chuck devices may be used for metal substrate 12. It is preferable to form a temperature adjusting means inside metal substrate 12 consisting of heating medium flow routes (not shown) through which a heating medium passes for the purpose of adjusting the temperature of the wafer.

Electricity insulating elastic layer 14 has superior electricity insulating and stress relieving properties, and is a material which is highly adhesive with metal substrate 12 and insulating film layer 16. It is also desirable that electricity insulating elastic layer 14 have excellent thermal resistance.

An adhesive having high stress relieving capabilities as well as abundant elasticity with a low Young's ratio is particularly preferred.

As a material satisfying these conditions, a rubber component may be added to an adhesive to provide a suitable degree of elasticity to the adhesive layer. As a result, stress can be relieved and bowing of ceramic layer 22 avoided, even when stress arises due to different coefficients of thermal expansion for the ceramic plate and the metal substrate, or due to volume changes in the adhesive layer itself.

However, in adhesives which simply include a rubber component, the rubber component deteriorates due to radicals or high temperatures during repeated wafer treatment using plasma and the like. As a result, elasticity is gradually lost and the stress relief effect gradually decreases, bringing about bowing of the ceramic layer and a deterioration in the flatness of the wafer adsorbing surface.

Accordingly, a material which includes both a rubber component and a phenol-type antioxidant is preferred as a material satisfying all of the above-stated conditions while also resolving the inconvenience caused by the deterioration as described above.

One or a mixture of two or more copolymers selected from the group comprising acrylonitrile-butadiene copolymer, olefin derived copolymers, and polyphenyl ether copolymer is particularly preferred as the rubber component, with acrylonitrile-butadiene copolymer being particularly suitable. Acrylonitrile-butadiene copolymer has suitable elasticity, and offers superior efficacy in relieving the stress applied on ceramic layer 22.

The phenol-type antioxidant is effective in preventing the deterioration of the rubber component by absorbing the radicals generated by the rubber component upon exposure to high heat. As a result, it is possible to avoid a deterioration in the elasticity of electricity insulating elastic layer 14. A hindered phenol-type antioxidant is preferred for use as this type of phenol antioxidant, with the optimal compound being one which has three or more phenol groups in which two or more t-butyl groups are bonded and which has a molecular weight of 700 or greater, and preferably a molecular weight in the range of 750~1500. When this condition is met, the rubber component does not readily deteriorate even when exposed to high heat, and the efficacy in relieving stress on the adhesive layer can be maintained for a long period of time.

For electricity insulating elastic layer 14, the adhesive agent which contains a compound containing 2 or more maleimide groups is preferably employed in order to improve thermal resistance thereof.

For more preferable adhesive agent, 10~90 wt % (preferably 50~90 wt %, and optimally 60~80 wt %) of acrylonitrile-butadiene copolymer, 90~10 wt % (preferably 50~10 wt %, and optimally 40~20 wt %) of a compound containing 2 or more maleimide groups, 0.3~20 wt % (preferably 0.3~10 wt %, and optimally 3~7 wt %) of phenol type antioxidant, and within 5 wt % (preferably 0.1~2 wt %, and optimally 0.1~1 wt %) of a reaction promoter like peroxide, are combined to form a mixture which is then dissolved in a suitable organic solvent. Such a adhesive agent has excellent electric reliance as well as thermal resistance. After applying this mixture, the organic solvent is vaporized. Following semi-hardening, a suitable electricity insulating elastic layer 14 can then be formed by bonding together the surfaces to be adhered and subjecting the arrangement to a heat treatment.

For the acrylonitrile-butadiene copolymer, it is suitable to employ one or a mixture of two or more of copolymers from the group comprising acrylonitrile-butadiene copolymer containing carboxyl group having a carboxyl group equivalent of 30~10,000 and a weight average molecular weight of 1,000~200,000; acrylonitrile-butadiene copolymer containing acrylic group having an acrylic group equivalent of 500~10,000 and a weight average molecular weight of 1,000~200,000; acrylonitrile-butadiene copolymer containing epoxy group having an epoxy group equivalent of 500~10,000 and a weight average molecular weight of 1,000~200,000; acrylonitrile-butadiene copolymer having a weight average molecular weight of 1,000~200,000; and acrylonitrile-butadiene copolymer containing piperazinyl ethyl aminocarbonyl group having an amino group equivalent of 500~10,000 and a weight average molecular weight of 1,000~200,000. The aforementioned weight average molecular weights are more preferably in the range of 3000~80000.

It is preferable that the phenol-type antioxidant have a weight reduction rate upon heating of 5% or less when heated at 200° C. according to the thermogravimetric analysis method. Note that the weight reduction rate upon heating is the value measured after increasing the temperature of the antioxidant from room temperature to 200° C. at a rate 10° C/min.

Specific examples of the phenol-type antioxidant include 1,3,5-tris(3,5-di-t-butyl-4-hydroxybenzyl)-s-triazine-2,4,6-(1H,3H,5H) trion (molecular weight: 784, weight reduction rate upon heating: 0%); 1,1,3-tris(2-methyl-4-hydroxy-5-t-butylphenyl)butane (molecular weight: 545, weight reduction rate upon heating: 2.8%); tetrakis [methylene(3,5-di-t-butyl-4-hydroxy hydrocinnamate)]methane (molecular weight: 1178, weight reduction rate upon heating: 0.2%); 1,3,5-trimethyl-2,4,6-tris(3,5-di-t-butyl-4-hydroxybenzyl) benzene (molecular weight: 775, weight reduction rate upon heating: 0%); and the like. In contrast, 2,6-di-t-butyl phenol has a molecular weight of 206.33 and a weight reduction rate upon heating of 86%.

A filler may be added to electricity insulating elastic layer 14, examples thereof including silica, quartz powder, alumina, calcium carbonate, magnesium oxide, diamond powder, mica, kaolinite, fluororesin powder, silicon powder, polyimide powder, zirconium powder or the like. These fillers may be used alone or in combinations of two or more. The amount of filler contained is within 70 wt % of the total solid component, with a range of 5~40 wt % being preferred. When the filler is included in an amount in excess of 70 wt %, a decrease in viscosity during working results, while the adhesive strength and hardness following hardening falls.

The thickness of electricity insulating layer 14 is not restricted. However, a range of 20~200 μm is preferred, 40~200 μm is more preferable, and 40~100 μm is optimal.

Taking into consideration such electrical properties as the dielectric constant ε, the dielectric loss coefficient tan δ, the withstanding voltage and the like, insulating film layer 16 is preferably an insulating film having a thermal resistance of 150° C. or greater. Examples of insulating film having a thermal resistance in excess of 150° C. include fluororesins (fluoroethylene-propylene copolymer, etc.), polyether sulfone, polyether ketone, cellulose triacetate, silicon gum, polyimide or the like. Polyimide is particularly preferred. Examples of polyimide film include films marketed under such commercial names as Kapton (manufactured by Toray-DuPont), Apical (manufactured by KANEKA CORP.), Upilex (manufactured by Ube Industries Ltd.), and the like.

The thickness of insulating film layer 16 is not particularly restricted, with a range of 10~75 μm being preferred, and a range of 10~50 μm being even more preferable. While a thinner film layer is preferred from the perspective of thermal conductivity, a range of 25~50 μm is particularly desirable when giving consideration to mechanical strength, withstanding voltage, and durability.

Electrode 18 is formed to have a specific pattern, and consists of a conductive material. Nickel, chrome, aluminum and the like are preferred when forming electrode 18 using vapor deposition or sputtering, while copper, chrome and the like are preferred when forming electrode 18 by plating. In addition, tin, gold, palladium and the like, or alloys thereof, are also acceptable. In particular, gold, platinum, palladium, molybdenum, magnesium, tungsten and alloys thereof offer superior workability and ease of printing for handling in paste or powder form. Of these, palladium alloy offers excellent conductivity and workability.

The thickness of electrode 18 is not particularly restricted but is preferably in the range of 0.1~10 μm, and even more preferably in the range of 0.5~8 μm. When the thickness of the film is less than 0.1 μm, not only is it difficult to form a uniform film, but it is difficult to maintain stable conductivity in the case of a highly reactive material like aluminum since oxidation readily occurs. On the other hand, when the thickness of the film exceeds 10 μm, it becomes expensive to form electrode 18 using vapor deposition or plating methods.

Figure 2:
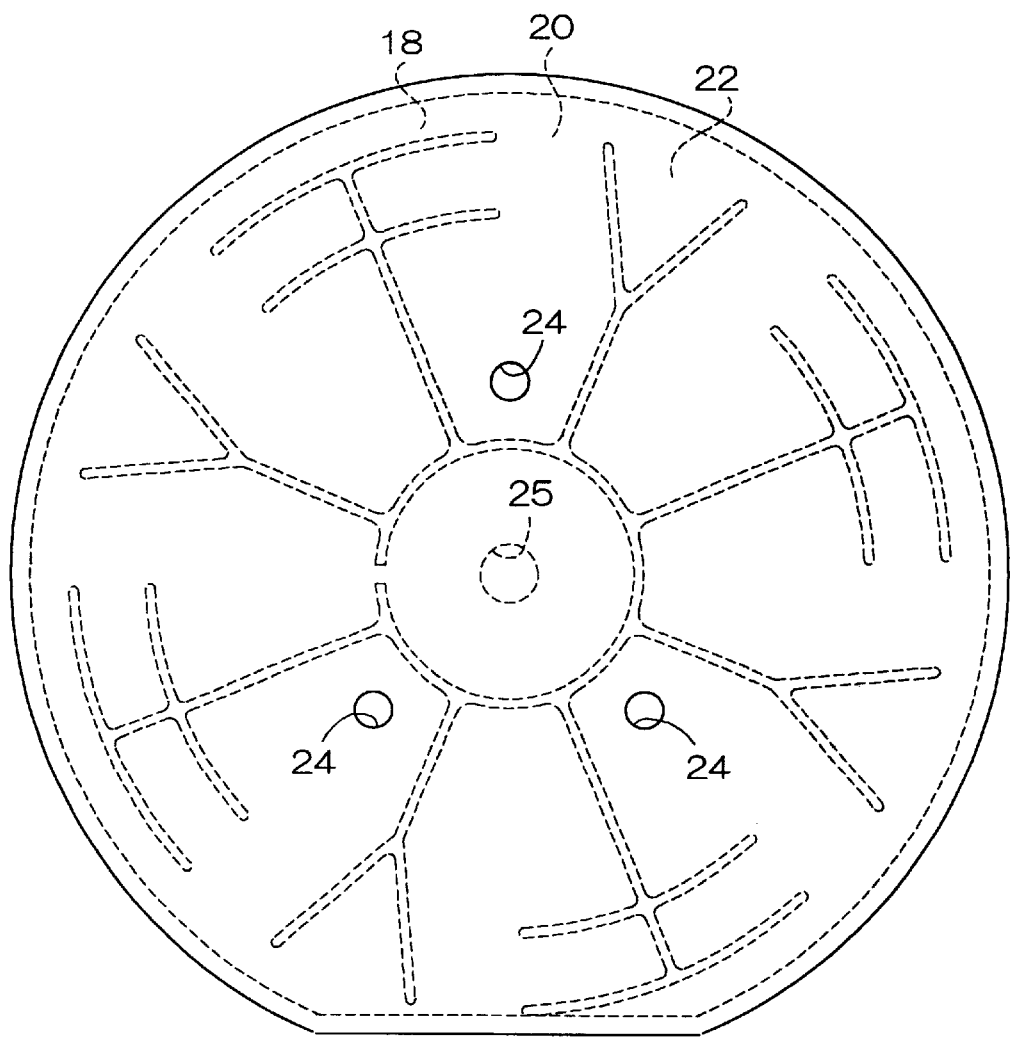
FIG. 2 is a planar view of the same electrostatic chuck device.

The flat electrode 18 as shown in FIG. 2 is one example of the shape of electrode 18. A variety of other shapes are also possible.

An adhesive which has high adhesion and thermal resistance is acceptable as the adhesive for adhesive layer 20, with the same material as that employed in electricity insulating elastic layer 14 being desirable. In order to ensure a high thermal resistance, a thermosetting resin is preferred.

The thickness of adhesive layer 20 is not particularly restricted. However, in order to increase thermal conductance, a thinner layer is more desirable. Specifically, a thickness in the range of 5~100 μm is preferred, with a range of 5~50 μm being more preferred, a range of 5~30 μm being even more preferred, and approximately 10 μm being desirable.

It is preferable that electricity insulating elastic layer 14 be thicker than adhesive layer 20.

Ceramic layer 22 must have excellent electricity insulating and thermal conductivity properties, and be resistant to solvents. Specifically, materials having a flat surface are employed, with alumina, aluminum nitride, silicon nitride, silicon carbide, ziconium, and glass being preferred. Of these, alumina ceramic is preferred from a cost perspective.

The thickness of ceramic layer 22 is not restricted. However, from the perspective of maintaining sufficient durability while losing heat from adsorbing surface 30, a range of 0.1~1.0 mm is preferred, with a range of 0.2~0.5 mm being preferable.

As shown in FIG. 2, three penetrating holes 24 are formed in electrostatic chuck device 10 passing through vertically from metal substrate 12 to ceramic layer 22. Elevating rods (not shown) are disposed inside these penetrating holes 24. These elevating rods project upward from the wafer adsorbing surface, thereby raising and lowering the wafer.

An electricity supply hole 25 is formed passing vertically thorough metal substrate 12, electricity insulating elastic layer 14, and insulating film layer 16. An electricity communicating means 27, such as a lead wire or a connecting pin, is connected to electrode 18 inside electricity supply hole 25 via a soldering or other such connector 26. An external voltage generating device is connected via this electricity communicating means 27, to supply voltage to electrode 18.

When voltage is impressed on electrode 18, a polarization charge is generated at the adsorbing surface of ceramic layer 22, thereby adsorbing the semiconductor wafer or other such object to be adsorbed.

The inside of electricity supply hole 25 is sealed with an insulating body 28 such as a resin.

A plurality of gas pathways (not shown) may be formed in metal substrate 12, electricity insulating elastic layer 14, insulating film layer 16, adhesive layer 20, and ceramic layer 22, opening on the wafer adsorbing surface. By blowing a small amount of inert gas, and particularly helium gas which has excellent heat transference, through these gas pathways, cooling of the semiconductor wafer can be promoted.

Here, other layers may also be included as needed.

The application of the present invention's electrostatic chuck device is not limited to wafers as the object to be adhered. Rather, any object is acceptable, provided that it is a conductor or semiconductor.

This electrostatic chuck device is formed by 1) a step for forming the electrode layer on one surface of the insulating film; 2) a step for laminating a ceramic layer on to the electrode layer via an adhesive; 3) a step for laminating an electricity insulating elastic layer containing a rubber component and phenol-type antioxidant to the non-electrode layer surface of the insulating film; and 4) a step for bonding the laminate obtained in 3) to the metal substrate. Specifically, this electrostatic chuck device is formed as follows.

First, an electrode 18 having a specific pattern is formed to one side of insulating film layer 16. It is also possible to form the metallic film comprising this electrode pattern directly onto insulating film layer 16. When forming an electrode 18 having a complex pattern, however, it is even easier to employ a method using a photoresist. For example, a metallic film may be formed over entire surface of one side of insulating film layer 16 using a sputtering, vapor deposition or plating method, with the photoresist layer then formed on top of this metallic film. The photoresist layer may be formed by coating a liquid resist and then drying, or by bonding together a photoresist film (dry film) on top of the metallic film using thermocompression bonding.

Next, the photoresist layer is pattern exposed and developed. After removing the photoresist on the portion where the metallic film is to be dissolved, the exposed portion of the metallic film is etched and washed, the resist is peeled away, and drying is then performed to form an electrode 18 of a specific shape. These operations may be carried out using a conventional method for forming photoresist patterns.

After electrode 18 is formed on insulating film layer 16, a liquid or film adhesive for forming adhesive layer 20 is coated or laminated over the entire surface of the electrode 18 side of insulating film layer 16 so as to cover electrode 18 and so that the surface of insulating film layer 16 is flat. The adhesive is then dried and semi-hardened to form adhesive layer 20, bonded together with ceramic layer 22. When adhesive layer 20 includes a curable adhesive, the hardening process may be performed by carrying out suitable heating as needed.

On the surface of insulating film layer 16 on which the electrode is not formed, a specific adhesive is coated to form electricity insulating elastic layer 14 which is adhered to metal substrate 12.

It is desirable to form an electricity supply hole 25 in insulating film layer 16 and metal substrate 12, in the direction of the thickness thereof. As a result, electricity communicating means 27 is connected to electrode 18, and electricity supply hole 25 is sealed by insulator 28.

In this way, the present invention's electrostatic chuck device is formed.

In addition, for example, a method is suitable in which metallic foil (copper foil, for example) is laminated to one surface of insulating film layer 16 via an adhesive (thermosetting adhesive, for example). However, a sputtering, vapor deposition or plating method is preferred since the layer can be made thinner.

As discussed above, a rubber component may be added to electricity insulating elastic layer 14 for the purpose of providing a stress relief effect. However, tackiness may generate on the surface of electricity insulating elastic layer 14 arising from this rubber component. When an electricity insulating elastic layer in which tacking has occurred is exposed, operability and productivity may be impaired when manufacturing the electrostatic chuck during the step of opening penetrating holes 24 prior to bonding together the metal substrate and the electricity insulating elastic layer, or during the step of positioning electricity insulating elastic layer 14 to metal substrate 12, for example.

In order to prevent this type of problem, an insulating adhesive layer is provided adjacent to at least the surface of electricity insulating elastic layer 14 on the metal substrate side thereof, and preferably to both surfaces of electricity insulating elastic layer 14.

Figure 6:
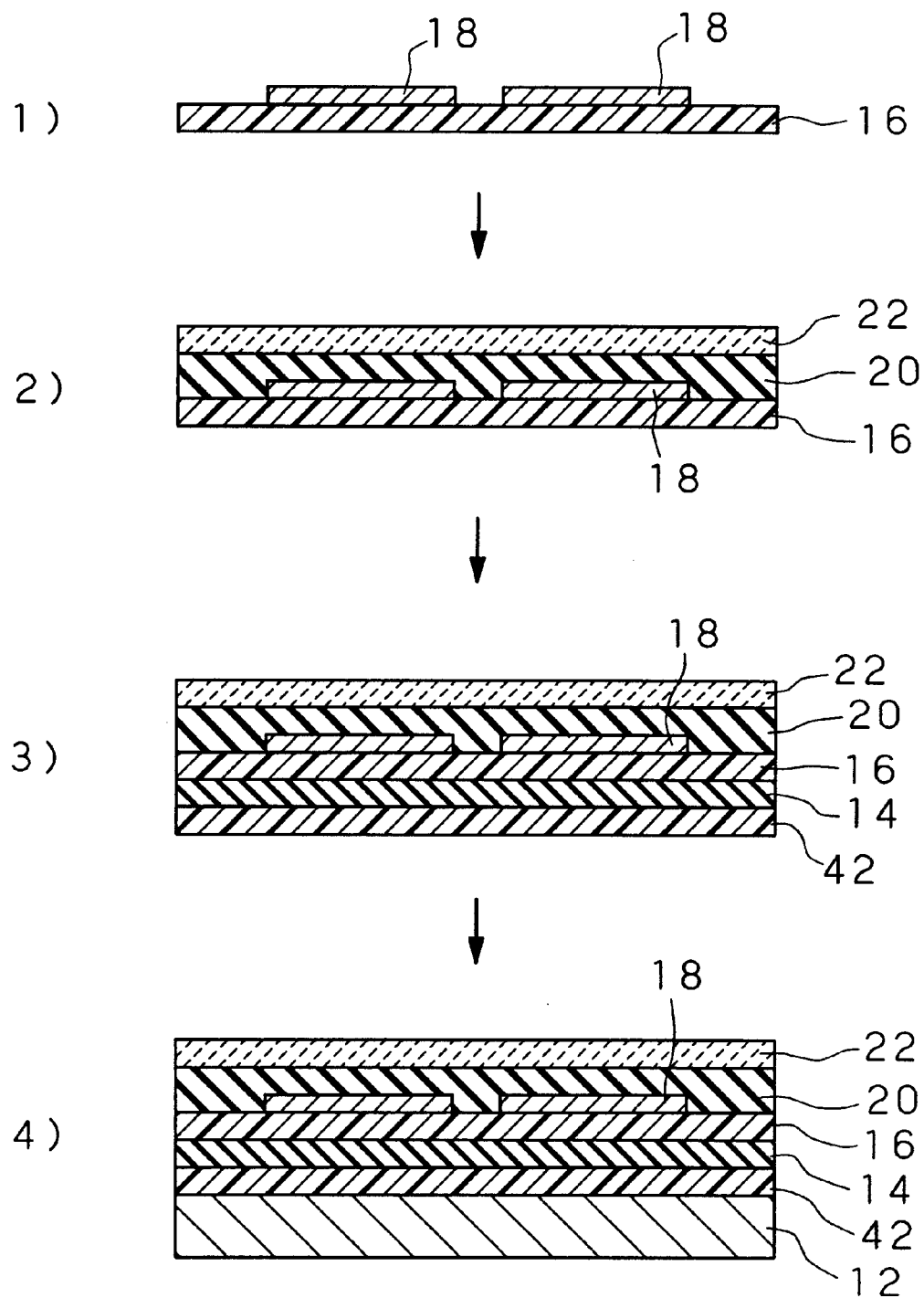
FIG. 6 is a lateral cross-sectional view showing an embodiment of the method for manufacturing the electrostatic chuck device according to the present invention.
Figure 7:
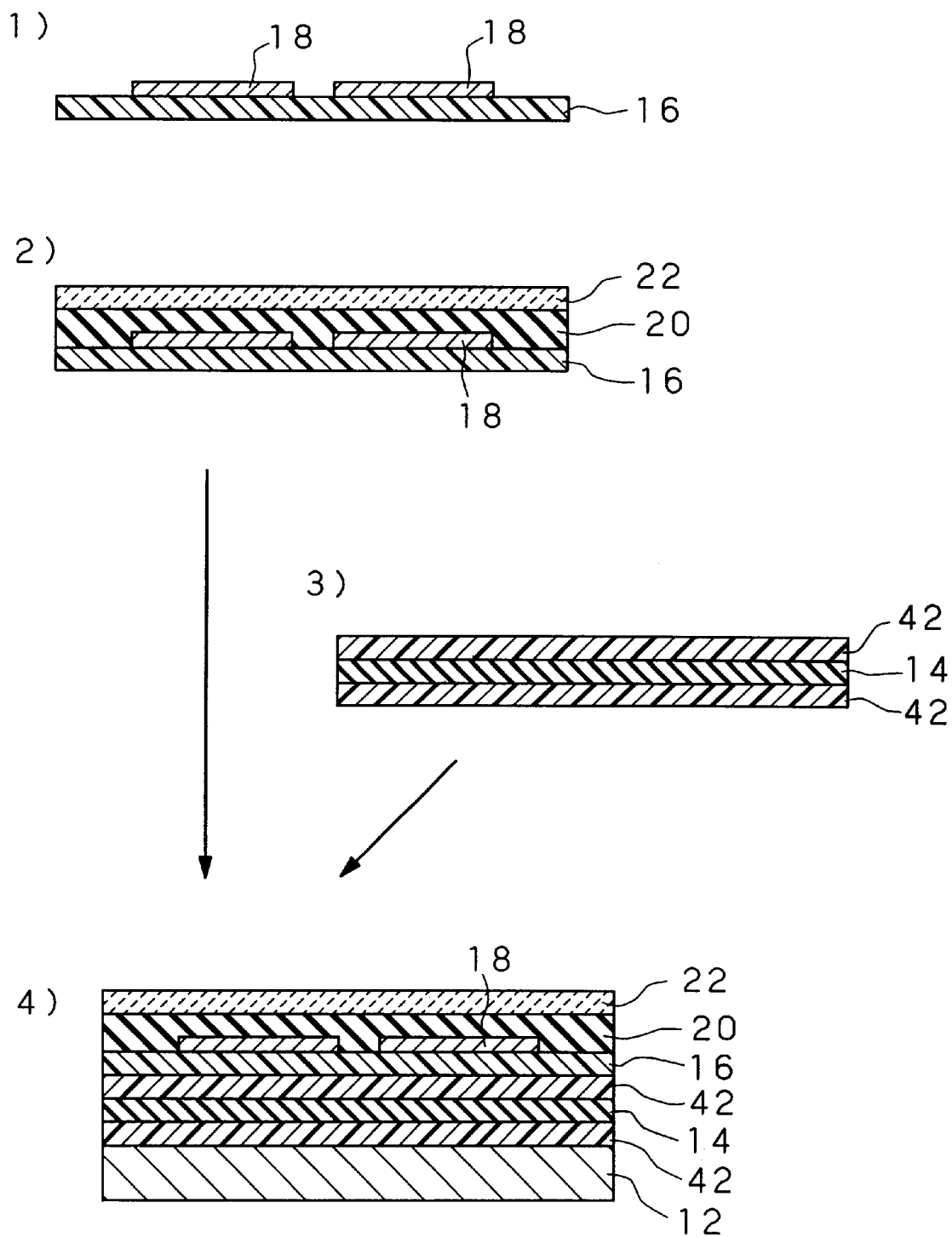
FIG. 7 is a lateral cross-sectional view showing an embodiment of the method for manufacturing the electrostatic chuck device according to the present invention.

In other words, as shown by 4) in FIG. 6, insulating adhesive layer 42 can be provided in between electricity insulating elastic layer 14 and metal substrate 12, and preferably, as shown by 4) in FIG. 7, is provided adjacent to both surfaces of electricity insulating elastic layer 14.

It is preferable that insulating adhesive layer 42 has higher electricity insulating capabilities such as breakdown voltage and reduced tackiness at room temperature than electricity insulating elastic layer 14, and excellent adhesion with the adjacent electricity insulating elastic layer, insulating film layer, and metal substrate 12. In addition, a thinner insulating adhesive layer 42 is preferred in order to prevent deterioration of stress relieving effect of electricity insulating elastic layer 14 and to minimize deterioration of the heat conduction as a whole.

The thickness of insulating adhesive layer 42 in the range of 0.1~30 μm is preferred. For absorbing unevenness of the adherend and preventing deterioration of heat conduction, the thickness of insulating adhesive layer 42 in the range of 3~20 μm is more preferred.

From the perspective of adhesion with the adherend, insulating adhesive layer 42 should possess excellent adhesion with metal substrate 12 having metal or metal oxide layer at the surface thereof, with electricity insulating elastic layer containing rubber as a main component, and with insulating film layer such as polyimide film. In order to satisfy this requirement, thermosetting adhesives containing epoxy resins, amine compounds, phenol resins, polyamide, acid anhydrides, or the like are preferable, with epoxy resin containing adhesive being particularly preferable.

Rubber, silicone resin, or polyimide may be added to insulating adhesive layer 42 with a range so as not to cause problems on tackiness, electricity insulation, or adhesion. In addition, inorganic or organic fillers may be added in order to control tackiness or to obtain enough hardness for handling.

By including an insulating adhesive layer 42 in between metal substrate 12 and electric insulating elastic layer 14, the problems encountered in handling and operability during manufacture of the electrostatic chuck device are resolved. In addition, by directly adhering electricity insulating elastic layer 14 and metal substrate 12, the effect of excellent adhesion with metal substrate 12 is also achieved.

An electrostatic chuck device designed such that an insulating adhesive layer 42 is provided adjacent to one surface of electricity insulating elastic layer 14 can be manufactured using the method shown in FIG. 6, for example.

First, in the aforementioned method, an electrode layer 18 is formed to one surface of insulating film 16 (step 1 in FIG. 6). Next, a ceramic layer 22 is laminated on to electrode layer 18 via an adhesive 20 (step 2 in FIG. 6). An electricity insulating elastic layer 14, containing a rubber component and phenol-type antioxidant, and insulating adhesive layer 42 are sequentially layered onto the non-electrode layer of insulating film 16 (step 3 in FIG. 6). An insulating adhesive layer 42 is then stacked on and bonded to metal substrate layer 12 (step 4 in FIG. 6). The method discussed above may be employed as the specific method for each of these steps.

An electrostatic chuck device designed such that an insulating adhesive layer 42 is provided adjacent to each surface of electricity insulating elastic layer 14 can be produced according to the method shown in FIG. 7, for example.

First, in the aforementioned method, an electrode layer 18 is formed to one surface of the insulating film 16 (step 1 in FIG. 7). Next, a ceramic layer 22 is laminated on to the electrode layer 18 via adhesive 20 (step 2 in FIG. 7).

An adhesive sheet 44 is formed (step 3 in FIG. 7) wherein insulating adhesive layers 42,42 are laminated to both surfaces of electricity insulating elastic layer 14, which contains a rubber component and phenol-type antioxidant. An example of a method for making this adhesive sheet 44 is as follows. First, a release film is produced which has an electricity insulating elastic layer 14 formed to one surface thereof, and two release films are produced which respectively have an insulating adhesive layer 42 formed to one surface thereof. The insulating adhesive layer 42 of one of the two release films on which this layer 42 has been formed is stacked onto the electricity insulating elastic layer 14 of the release film on which layer 14 has been formed, and attached through compression. Next, the release film on the electrically insulating elastic layer 14 side of this laminate is peeled away, exposing electrically insulating elastic layer 14. Another insulating adhesive layer 42 is then stacked on this exposed electricity insulating elastic layer 14 and attached by compression. In this way, an adhesive sheet 44 in which an insulating adhesive layer is laminated to both sides of the electricity insulating elastic layer can be obtained.

Next, the non-electrode surface of the insulating film is bonded to the metal substrate via adhesive sheet 44 from which both release films have been removed.

Because the adsorption surface of the present invention's electrostatic chuck device consists of a ceramic layer, wear and deformation or other such damage does not readily occur, so that durability is extremely high.

In addition, even if stress is generated due to different coefficients of thermal expansion between metal substrate 12 and a ceramic layer 22 when heat treating semi-hardened electricity insulating elastic layer 14 and adhesive layer 20 to form electricity insulating elastic layer 14 and adhesive layer 20, or when cooling to room temperature, this stress is relieved due to electricity insulating elastic layer 14 which contains rubber as a component in the presence of antioxidant, in the present invention's electrostatic chuck device. As a result, the stress applied on ceramic layer 22 is reduced, so that bowing of the ceramic layer can be avoided.

By including a phenol-type antioxidant having superior thermal resistance in electricity insulating elastic layer 14 or adhesive layer 20, radicals generated by this rubber component are absorbed, thereby enabling the prevention of oxidative deterioration of the rubber component over a long period of time.

Accordingly, it is possible to prevent over a long period of time such problems as bowing of ceramic layer 22, local reduction in the ability to cool the wafer due to separation occurring along the contact boundary (the outer periphery in particular) between ceramic layer 22 and adhesive layer 20, reduction in the ability to adsorb the wafer by a decrease of the flatness of the wafer adsorbing surface, significant leaking of helium gas used in cooling which is supplied in small amounts between the wafer adsorption surface and the wafer, and the like. Thus, the operating costs required for replacement of parts can be reduced.

The present invention will now be explained using preferred embodiments thereof.

Formulation of Adhesive (1)

80 parts by weight of acrylonitrile-butadiene copolymer having piperazinyl ethyl aminocarbonyl groups at either end (Hycar ATBN, manufactured by Ube Industries, Ltd.) (m=83.5, n=16.5, weight average molecular weight: 3600, acrylonitrile content: 16.5 wt %) was dissolved in a toluene/methyl ethyl ketone mixture (1:1). 20 parts by weight of the maleimide compound expressed by the following chemical formula (I), 0.1 parts by weight lauroyl peroxide (Per Lauroyl-L, manufactured by NOF CORP.), and 3 parts by weight of the hindered phenol-type antioxidant tetrkis-methylene-3-(3,5-di-t-butyl-4-hydroxy phenyl) propionate methane (Adecustub AO-60, ASAHI DENKA KOGYO K. K.), were mixed into this solution, and dissolved in tetrahydrofuran to obtain a liquid adhesive (1) in which the solid component was 40wt %.

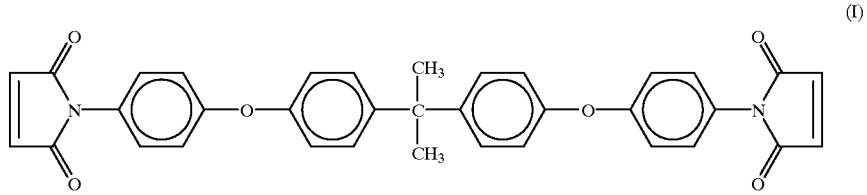

(I)

Formulation of Adhesive (2)

100 parts by weight of acrylonitrile-butadiene copolymer (weight average molecular weight: 250,000, acrylonitrile content: 27 wt %), 20 parts by weight of p-t-butyl phenol resol phenol resin (CKM-1282, manufactured by SHOWA HIGHPOLYMER CO.,LTD.), 20 parts by weight of novolak epoxy resin (EOCN-1020, manufactured by Nippon Kayaku Co., Ltd.), 25 parts by weight of the maleimide compound expressed by the above formula (I), 5 parts by weight of 1,3-bis(3-aminopropyl)-1,1,3,3-tetramethyldisiloxane, 0.1 parts by weight of α-α'-bis(t-butylperoxy)-m-diisopropylbenzene (Per Butyl-P, manufactured by NOF CORP.), and 3 parts by weight of 1,3,5-tris(3,5-di-t-butyl-4-hydroxybenzyl)-s-triazene-2,4,6-(1H,3H,5H) trion (Adecustub AO-20, manufactured by ASAHI DENKA KOGYO K. K., were mixed together, and dissolved in tetrahydrofuran to obtain a liquid adhesive (2) in which the solid component was 40 wt %.

Formulation of Adhesive (3)

40 parts by weight of acrylonitrile-butadiene copolymer having piperazinyl ethyl aminocarbonyl groups at either end (Hycar ATBN, manufactured by Ube Industries, Ltd.) (m=83.5, n=16.5, weight average molecular weight: 3600, acrylonitrile content: 16.5 wt %) and 40 parts by weight of acrylonitrile-butadiene copolymer having vinyl groups at either end (Hycar VTBN, manufactured by Ube Industries, Ltd.) (m=83.5, n=16.5, weight average molecular weight: 3600, acrylonitrile content: 16.5 wt %) were dissolved in a toluene/methyl ethyl ketone mixture (1:1). 20 parts by weight of the maleimide compound expressed by the above chemical formula (1), 0.1 parts by weight α-α' bis (t-butylperoxy-m-isopropyl)benzene (Per Butyl-P, manufactured by NOF CORP.), and 3 parts by weight of the antioxidant 1,3,5-trimetyl-2,4,6-tris(3',5'-di-t-butyl-4-hydroxy-benzyl)benzene (Adecustub AO-330, manufactured by ASAHI DENKA KOGYO K. K.), were mixed into this solution, and dissolved in tetrahydrofuran to obtain a liquid adhesive (3) in which the solid component was 40 wt %.

Formulation of Adhesive (4)

An adhesive (4) having the composition shown in the following Table 1 was formulated.

TABLE 1

| Component | blending amount (parts by weight) |
|---|---|
| polyamide resin (Tomide #1350, manufactured by Fuji Kasei Kogyo, IPA/toluene solution having 25 wt % solid component) | 300 |
| epoxy resin (Epicoat 828, manufactured by Yuka Shell Epoxy) | 100 |

TABLE 1-continued

| Component | blending amount (parts by weight) |
|---|---|
| novolak phenol resin (CKM2432, manufactured by SHOWA HIGHPOLYMER CO., LTD., MEK solution having 50 wt % solid component) | 30 |
| 1% MEK solution of 2-methylimidazole | 0.3 |

Formulation of Adhesive (5)

100 parts by weight of epoxyacrylate (R-551, manufactured by Nippon Kayaku Co., ltd.) and 1 part by weight of benzoyl peroxide were dissolved in a toluene/methyl ethyl ketone mixture (1:1), to formulate an adhesive (5) in which the solid component was 40 wt %.

Embodiment 1

Nickel was vapor deposited to a thickness of 500 angstrom to one surface of an insulating film consisting of a 25 μm polyimide film (Kapton, manufactured by Toray-DuPont). Copper plating was then carried out to form a 2 μm thick electrode layer. Resist coating, developing, etching, and washing were then performed to form an electrode 18 of the form shown in FIG. 2. Adhesive (1) was then coated to the surface on which the electrode was formed so as to have a thickness of 10 μm when dried. The product obtained after drying and semi-hardening (semi-curing) by heating for 5 minutes at 150° C. was then bonded together with a smooth-surface, 8-inch diameter, 0.4 mm thick alumina ceramic plate.

Next, adhesive (1) was formed into a film 80 μm thick on the other surface (non-electrode surface) of the insulating film, semi-hardened (B-stage), and bonded together was a metal substrate made of aluminum. The adhesive was then hardened by step curing at 100~150° C., to obtain the electrostatic chuck device shown in FIG. 1.

Note that this design enables a voltage to be impressed between electrode 18 and metal substrate 12 by forming an electricity supply hole 25 in metal substrate 12, electricity insulating elastic layer 14 and insulating film layer 16 in the direction of the thickness thereof, and by passing an electricity communicating means 27 consisting of a conductive material through this electricity supply hole.

Embodiment 2

An electrostatic chuck device was formed in the same manner as in Embodiment 1, with the exception that adhesive (2) was used in place of adhesive (1).

Embodiment 3

An electrostatic chuck device was formed in the same manner as in Embodiment 1, with the exception that adhesive (3) was used in place of adhesive (1), and a silicon nitride ceramic plate of equal thickness was employed in place of the alumina ceramic plate.

Embodiment 4

Figure 3:
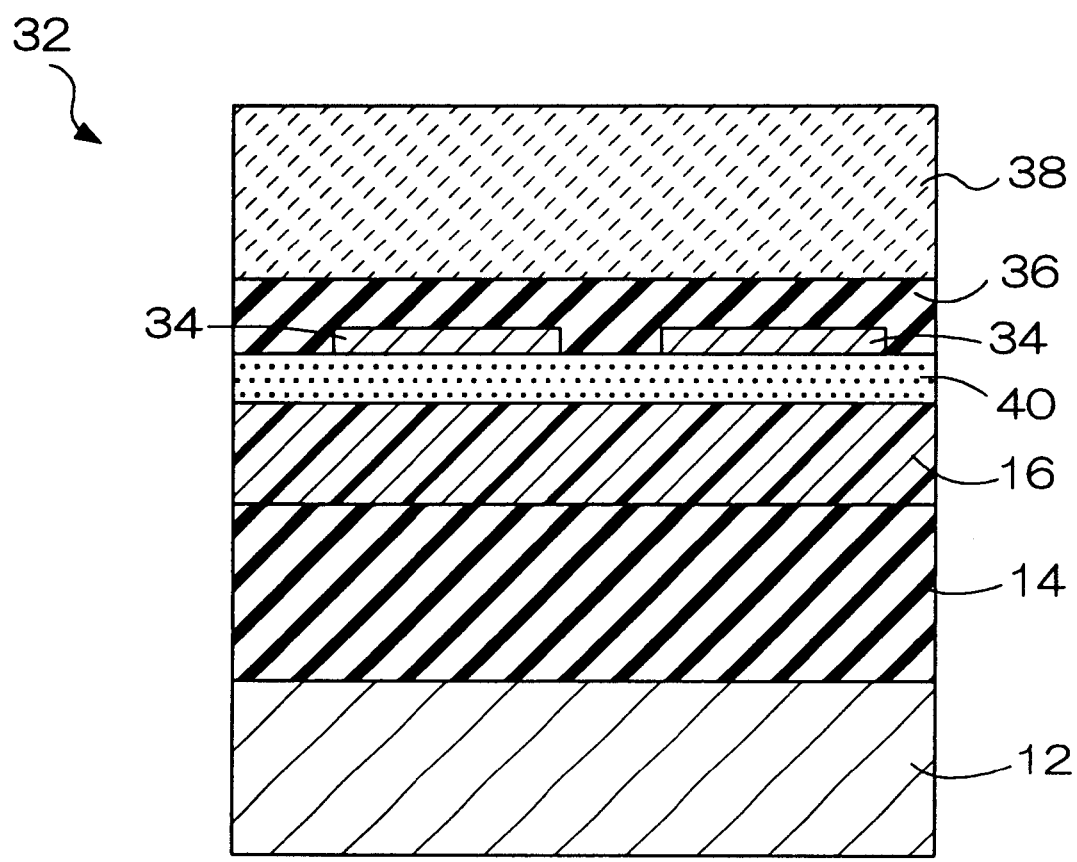
FIG. 3 is a lateral cross-sectional view showing the layer structure of the electrostatic chuck device according to Embodiment 4.
Figure 4:
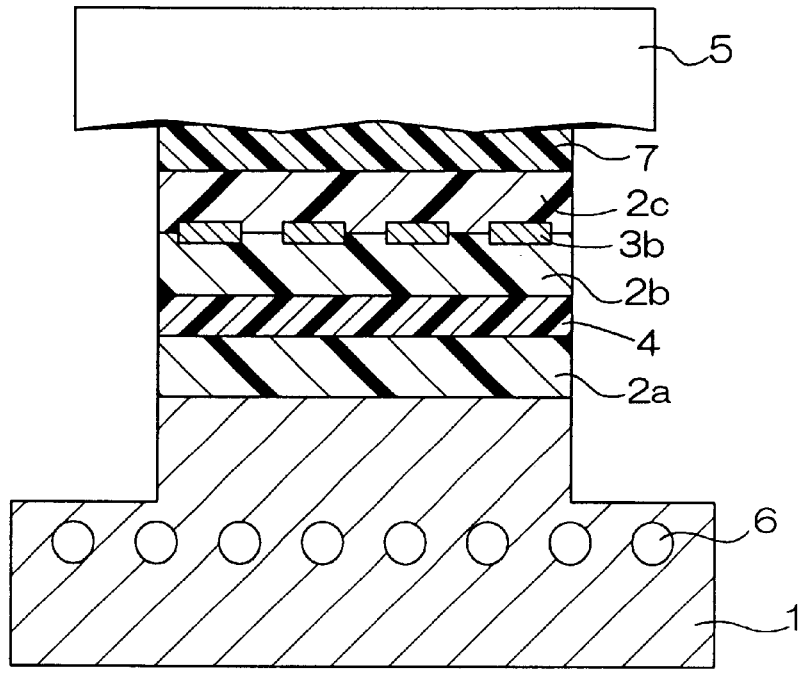
FIG. 4 is a lateral cross-sectional view of a conventional electrostatic chuck device.
Figure 5:
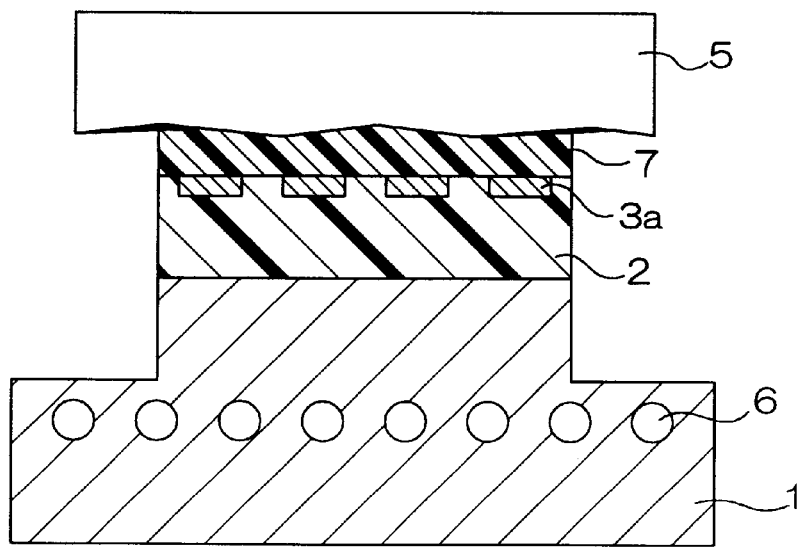
FIG. 5 is a lateral cross-sectional view of a conventional electrostatic chuck device.

An electrostatic chuck device 32 having the layer structure shown in FIG. 3 was formed.

First, adhesive (4) was coated to one surface of the 25 μm polyimide insulating film layer 16 employed in Embodiment 1, so as to have a thickness of 10 μm when dried. Adhesive layer 40 was formed after drying for 2 minutes at 150° C. Thereafter, an electrolytic copper foil 20 μm thick was bonded on, and a heating treatment was performed for 2 hours at 150° C. Resist coating, exposure, development, etching, and washing were then carried out to form electrodes 34,34 of the specified shape. Adhesive (4) was applied to the electrode surface so as to have a thickness following drying of 10 μm. Drying and semi-hardening were performed for 2 minutes at 150° C., to form an adhesive layer 36. The film was then bonded together with a smooth-surface, 8 inch diameter, 0.3 mm thick alumina ceramic plate 38.

Next, adhesive (1) was coated to the other surface of insulating film layer 16 (non-electrode surface) so as to have a thickness of 80 μm following drying. Semi-hardening was then performed to form electricity insulating elastic layer 14, which was then bonded together with a metal substrate 12 made of aluminum. The adhesive was hardened by step curing at 100~150° C., to form an electrostatic chuck device 32 of the structure shown in FIG. 3.

Embodiment 5

An electrostatic chuck device was formed in accordance with the method shown in FIG. 7.

An electrode layer 18 was formed to a polyimide insulating film layer 16 in the same manner as in Embodiment 1, and bonded together with an alumina ceramic plate via an adhesive.

Two respective layer structures were formed in which adhesive (5) was formed into a film on one surface of a release film and semi-hardened, so as to have a thickness of 10 μm after drying. In a separate step, adhesive (1) was formed into a film on one surface of a release film so as to have a thickness of 60 μm, and was semi-hardened. Adhesive layer (1) and one of the adhesive (5) layers were stacked together and adhered by compression. The release film on the adhesive (1) side was removed, and the other adhesive (5) layer was stacked on adhesive (1) layer, and adhered by compression. In this way, a sheet was obtained in which a release film (not shown) was laminated to either side of an adhesion sheet 44 in which adhesive (5) layers (insulating adhesive layers 42) were laminated to either side of an adhesive (1) layer (electricity insulating elastic layer 14). Next, one of the release films on adhesive sheet 44 was removed, and the non-electrode surface of insulating film layer 16 was bonded thereon. The other release film was then removed, and metal substrate 12 made of aluminum was bonded thereon. Step curing at 100~150° C. was carried out to harden the adhesive, thereby forming the present invention's electrostatic chuck device. Next, an electricity supply member was formed in the same manner as in Embodiment (1).

Embodiment 6

An electrostatic chuck device was formed in accordance with the method shown in FIG. 6.

An electrode layer 18 was formed to a polyimide insulating film layer 16 in the same manner as in Embodiment 1, and bonded together with an alumina ceramic plate via an adhesive.

Adhesive (1) was formed into a film on the other surface (non-electrode surface) of insulating film layer 16 so as to have a thickness of 70 μm after drying. Semi-hardening was carried out to form an electricity insulating elastic layer 14. Next, adhesive (5) was formed into a film so as to have a thickness of 10 μm, and semi-hardened to form insulating adhesive layer 42. This was then bonded together with metal substrate 12 made of aluminum. Step curing at 100~150° C. was carried out to harden the adhesive, thereby forming the present invention's electrostatic chuck device. Next, an electricity supply member was formed in the same manner as in Embodiment (1).

COMPARATIVE EXAMPLE 1

An electrostatic chuck device was made in the same manner as in Embodiment 1, with the exception that adhesive (5) was employed in place of adhesive (1).

COMPARATIVE EXAMPLE 2

Nickel was vapor deposited to a thickness of 500 angstrom to one surface of an insulating film consisting of a 25 μm polyimide film (Kapton, manufactured by Toray-DuPont). Copper plating was then carried out to form a 2 μm thick electrode layer. Resist coating, developing, etching, and washing were then performed to form an electrode 18 of the form shown in FIG. 2.

Adhesive (1) was then coated to the surface on which the electrode was formed so as to have a thickness of 20 μm when dried. The adhesive layer was then formed by drying for 5 minutes at 150° C. to semi-harden.

In a separate step, adhesive (1) was coated to an alumina ceramic plate so as to have a thickness of 80 μm when dry. Drying was performed for 5 minutes at 150° C. to semi-harden, and a metal substrate of aluminum was then bonded there to.

The alumina ceramic plate was bonded to the adhesive layer formed to the aforementioned electrode surface, and hardened, to form an electrostatic chuck device in which the adsorption layer consisted of a polyimide insulating film.

Note that this design enables a voltage to be impressed between the electrode and the metal substrate by forming an electricity supply hole from the metal substrate through the ceramic plate in the direction of the thickness thereof, and by passing an electricity communicating means consisting of a conductive material through this electricity supply hole.

TEST EXAMPLE 1

The electrostatic chuck devices formed in Embodiments 1~6 and Comparative Examples 1 and 2 were placed in a heat cycle test device, heated to 150° C. and maintained at this temperature for 30 minutes. The samples were then cooled to −40° C. and maintained at this temperature for 30 minutes. After being subjected to 60 repetitions of this cycle, the samples were returned to room temperature, and evaluated using ultrasonic diagnosis for whether or not peeling had occurred in the adhesive layer.

The results showed that peeling did not occur in the electrostatic chuck devices formed in Embodiments 1~6 and Comparative Example 2 which had an electricity insulating elastic layer 14 possessing superior stress relieving properties. In contrast, the electrostatic chuck device formed in Comparative Example 1 showed partial peeling on the bottom surface of the ceramic plate.

TEST EXAMPLE 2

Steel wool #0000 was employed to make 10 rubbing circuits with a load of 140 g/cm² across the adsorption surface of the electrostatic chuck devices formed in Embodiments 1~6 and Comparative Examples 1 and 2. The surface was then evaluated by visual inspection for resistance to friction damage.

These results indicated no change at all in the adsorption surface of the electrostatic chuck devices formed in Embodiments 1~6 and Comparative Example 1, confirming the superior resistance to friction damage possessed by these devices.

In contrast, many fine flaws could be observed on the adsorption surface of the electrostatic chuck device formed in Comparative Example 2. Accordingly, this device was found to have insufficient resistance to frictional damage.

TEST EXAMPLE 3

0.5 g of silica powder having an average particle diameter of 30 μm was placed on the adsorption surface (test site: diameter 10 mm) of the electrostatic chuck devices formed in Embodiments 1~6 and Comparative Examples 1 and 2. Flaws were then formed to the adsorption surface by compressing for 2 minutes at 50 kg/cm$^2$.

After removing the silica powder using an air gun, an electrode (made of brass) having a diameter of 25 mm was placed on the adsorption surface and subjected to a load of 500 g/cm$^2$. In this state, a voltage was impressed between the brass electrode on the adsorption surface and the electrode of the electrostatic chuck device. The voltage at which breakdown in insulation occurred was measured to evaluate durability.

For comparative purposes, the voltage at which breakdown in insulation occurred was measured for an electrostatic chuck device formed as in Comparative Example 2 in which no flaws were made.

These results are shown in Table 2. Note that these results are the average value obtained for 10 trials.

TABLE 2

| | voltage at which insulation breaks down (kV) |
|---|---|
| Embodiment 1 | >10 |
| Embodiment 2 | >10 |
| Embodiment 3 | >10 |
| Embodiment 4 | >10 |
| Embodiment 5 | >10 |
| Embodiment 6 | >10 |
| Comp. Example 1 | >10 |
| Comp. Example 2 | 5.0 |
| Comp. Example 2 (no flaws made) | 9.0 |

The high voltage resistance and superior durability of the devices formed in the Embodiments and Comparative Example 1 were confirmed from Table 2.

In contrast, when flaws were made to the electrostatic chuck device in Comparative Example 2, insulation breakdown occurred easily at a low voltage, so that there was insufficient durability.

TEST EXAMPLE 4

Adhesives (1)~(5) were respectively coated to one surface of a release film to which a mold-releasing treatment had been performed so as to have a thickness of 20 μm when dried. Heating and drying for 5 minutes at 150° C. in a heated air circulating dryer was performed. Heating for one hour at 180° C. was then carried out to harden the adhesive.

The release film was removed, and test samples were formed by cutting the resin material consisting of this hardened adhesive to 10×100 mm.

A universal tensile test machine (Tenshiron, manufactured by Shimadzu Corp.) was employed to stretch each of these samples at a rate of 50 mm/min, and the percentage of elongation immediately prior to breaking was measured. The results of these tests are shown in Table 3.

TEST EXAMPLE 5

Adhesives (1)~(5) were respectively coated to one surface of a release film to which a mold-releasing treatment had been performed so as to have a thickness of 20 μm when dried. Heating and drying for 5 minutes at 150° C. in a heated air circulating dryer was performed. After removing the release film, the hardened resin was held between a 76×52×0.9 mm borosilicate glass plate and a 76×52×5.0 mm aluminum plate. Bonding in a laminating device was performed, followed by heating at 120° C. for two hours to harden the adhesive.

After returning to room temperature, the depth of the bowing in the aluminum plate was measured using a digital depth microscope, and the rate of bowing was calculated using the following formula.

bowing rate (%)=(bowing depth (μm))/(diagonal length of aluminum plate (mm))×10$^{-1}$ The minimum and maximum values for the thickness of the adhesive layer (variation in thickness is particularly apt to occur in the four corners) were measured, and an inspection was made of whether or not foaming was present in the hardened adhesive layer. These results are shown in Table 3.

TABLE 3

| | percentage of elongation (%) | bowing depth (μm) | rate of bowing (%) | thickness of adhesive layer (μm) | presence or absence of foaming |
|---|---|---|---|---|---|
| Adhesive (1) | 230 | 18 | 0.020 | 19–22 | absent |
| Adhesive (2) | 170 | 8 | 0.009 | 18–21 | absent |
| Adhesive (3) | 200 | 15 | 0.016 | 19–21 | absent |
| Adhesive (4) | 25 | 30 | 0.032 | 12–22 | present |
| Adhesive (5) | 15 | 35 | 0.038 | 12–22 | present |

As is clear from the results for Test Example 4 shown in Table 3, the material consisting of adhesives (1)~(3) had an extremely large percentage of elongation. Accordingly, it may be understood that a laminate having a layer consisting of this adhesive (1)~(3) demonstrates an excellent stress relieving effect due to the high rate of elasticity.

In addition, as is clear from the results for Test Example 5 shown in Table 3, a structure employing adhesives (1)~(3) shows small bowing in the glass plate and little deviation in thickness. It is possible to be concluded that this is because the adhesive layer relieves stress generated due to the different expansion rates between the aluminum plate and the glass plate after heating-cooling process when adhesives (1)~(3) are employed. This demonstrates that when adhesives (1)~(3) are employed as components in a laminate, the obtained laminate acquires decreased bowing and the increased degree of flatness due to the stress relieving effect.

What is claimed:

1. An electrostatic chuck device comprising:
   a ceramic layer configured to provide an adsorption surface;
   a metal substrate;
   an electricity insulating elastic layer interposed between said ceramic layer and metal substrate; and
   an electrode interposed between the ceramic layer and said electricity insulating elastic layer, wherein said electricity insulating elastic layer comprises an adhesive that contains a rubber component and a phenol-type antioxidant.

2. An electrostatic chuck device according to claim 1, further comprising an insulating film formed between the electrode and the electricity insulating elastic layer.

3. An electrostatic chuck device according to claim 1, further comprising an insulating adhesive layer provided to at least the surface of said electricity insulating elastic layer on the side thereof nearest to said metal substrate.

4. An electrostatic chuck device according to claim 3, wherein said insulating adhesive layer is a thermosetting adhesive agent containing epoxy resin.

5. An electrostatic chuck device according to claim 1, wherein said rubber component comprises at least one copolymer selected from the group comprising acrylonitrile-butadiene copolymer, olefin derived copolymers, and polyphenyl ether copolymer.

6. An electrostatic chuck device according to claim 1, wherein the phenol-type antioxidant has three or more phenol groups in which two or more t-butyl groups are bonded.

7. An electrostatic chuck device according to claim 1, wherein said phenol-type antioxidant has a weight reduction rate upon heating of 5% or less when heated at 200° C.

8. An electrostatic chuck device according to claim 1, wherein said electricity insulating elastic layer contains a compound containing 2 or more maleimide groups.

9. A method for manufacturing an electrostatic chuck device, comprising:

forming an electrode layer on one surface of an insulating film;

laminating a ceramic layer on to said electrode layer via an adhesive;

laminating an electricity insulating elastic layer containing a rubber component and phenol-type antioxidant to the non-electrode layer surface of said insulating film to thereby form a laminate; and bonding the laminate to a metal substrate.

10. A method for manufacturing an electrostatic chuck device, characterized in the provision of steps for:

forming an electrode layer on one surface of an insulating film;

laminating a ceramic layer on to said electrode layer via an adhesive;

laminating an electricity insulating elastic layer containing a rubber component and phenol-type antioxidant, and sequentially an insulating adhesive layer to the non-electrode layer surface of said insulating film; and stacking and bonding said insulating adhesive layer to a metal substrate.

11. A method for manufacturing an electrostatic chuck device, comprising:

forming an electrode layer on one surface of an insulating film;

laminating a ceramic layer on to said electrode layer via an adhesive;

forming an adhesive sheet by laminating an insulating adhesive layer to at least one surface of an electricity insulating elastic layer containing a rubber component and a phenol-type antioxidant; and bonding the non-electrode layer surface of said insulating film to a metal substrate via said adhesive sheet.

* * * * *